United States Patent
Sakaguchi

(10) Patent No.: US 6,351,835 B1
(45) Date of Patent: Feb. 26, 2002

(54) HIGH SPEED LSI SPECTRAL ANALYSIS TESTING APPARATUS AND METHOD

(75) Inventor: Kazuhiro Sakaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/365,170

(22) Filed: Aug. 2, 1999

(30) Foreign Application Priority Data

Jul. 31, 1998 (JP) ............................................ 10-217318
Oct. 23, 1998 (JP) ............................................ 10-301843

(51) Int. Cl.⁷ ................................................ G06F 11/00
(52) U.S. Cl. ........................................ 714/724; 714/738
(58) Field of Search ................................ 714/724, 738; 324/751

(56) References Cited

U.S. PATENT DOCUMENTS 3,881,097 A * 4/1975 Lehmann et al.
5,633,595 A * 5/1997 Ueda et al.
6,047,393 A * 4/2000 Yamada

FOREIGN PATENT DOCUMENTS

JP 9-211088 8/1997

\* cited by examiner

Primary Examiner—Phung M. Chung
(74) Attorney, Agent, or Firm—Young & Thompson

(57) ABSTRACT

In an LSI testing apparatus, a test sequence generator produces at least one sequence of test signals each having a different test pattern. A source current sensor detects a source current flowing from a power voltage source to an integrated circuit device under test when the device is subjected to the sequence of test signals. Counter circuitry defines a window period equal to at least one sequence of the test signals. Analog-to-digital converter circuitry is activated during the window period to sample the source current and quantize sampled values of the source current to digital samples. A discrete Fourier transform analyzer analyzes the digital samples to produce a number of spectral values at frequencies k/T, where T represents the period of said sequence and k is an integer equal to or greater than unity. Decision circuitry makes a decision on the analyzed spectral values using a plurality of reference spectral values.

16 Claims, 5 Drawing Sheets

FIG. 4

| | REFERENCE RANGE | DEVICE A | DEVICE B | DEVICE C |
|---|---|---|---|---|
| POWER LEVELS | 28.5 ~ 26.5<br>40.6 ~ 36.6<br>12.5 ~ 11.5<br>6.8 ~ 6.2<br>20.2 ~ 18.2 | 27.7<br>39.0<br>12.0<br>6.4<br>20.1 | 27.7<br>(41.0)<br>12.5<br>(10.2)<br>18.5 | (28.6)<br>(36.1)<br>(14.2)<br>6.2<br>19.5 |
| PHASE VALUES | 169 ~ 165<br>14 ~ 10<br>291 ~ 287<br>96 ~ 92<br>130 ~ 126 | 166<br>12<br>290<br>92<br>127 | 165<br>10<br>289<br>93<br>129 | (159)<br>(8)<br>(293)<br>92<br>(133) |
| POWER COMPARATOR | | 5/5 | 3/5 | 2/5 |
| PHASE COMPARATOR | | 5/5 | 5/5 | 1/5 |
| DECISION | | GOOD | GOOD | BAD |

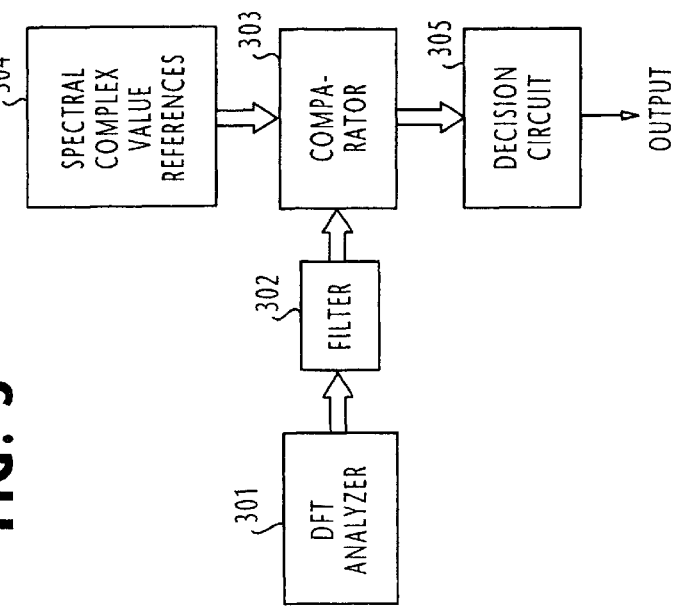

FIG. 6

| REFERENCE RANGE | DEVICE A | DEVICE B | DEVICE C |
|---|---|---|---|
| $2.4 + j4.4 \sim 2.0 + j4.0$<br>$23.8 - j1.0 \sim 22.8 - j0$<br>$-5.4 + j4.0 \sim -5.8 + j3.6$<br>$-11.8 - j11.0 \sim -12.2 - j11.4$<br>$4.0 + j12.8 \sim 3.6 + j12.4$ | $2.2 + j4.0$<br>$23.6 - j0.5$<br>$-5.5 + j3.7$<br>$-11.9 - j11.3$<br>$3.6 + j12.5$ | $2.2 + j4.0$<br>$22.9 - j0.4$<br>$(-5.9 + j3.5)$<br>$-11.8 - j11.1$<br>$(4.1 + j12.5)$ | $(2.8 + j4.1)$<br>$(22.0 - j0.8)$<br>$-5.5 + j3.6$<br>$(-11.0 - j12.8)$<br>$(3.5 + j12.0)$ |
| COMPARATOR | 5/5 | 3/5 | 1/5 |
| DECISION | GOOD | GOOD | BAD |

FIG. 5

301 DFT ANALYZER → 302 FILTER → 303 COMPARATOR → 305 DECISION CIRCUIT → OUTPUT

304 SPECTRAL COMPLEX VALUE REFERENCES → COMPARATOR

HIGH SPEED LSI SPECTRAL ANALYSIS TESTING APPARATUS AND METHOD

BACKGROUND OF THE INVENTION

1. Field of the Invention

The present invention relates generally to the testing of LSI devices, and more specifically to a testing apparatus and method for an integrated circuit device by observing spectral components of a source current when the device is activated by test signals.

2. Description of the Related Art

Japanese Laid-Open Patent Specification 09-211088 discloses an LSI testing apparatus by observing the power spectral component of a source current flowing into a device under test when the device is activated in response to test signals of different patterns which are generated in repeated sequences of period T. The power spectral component is one that occurs at the fundamental frequency 1/T.

It is important, however, to perform an LSI testing in as short a time as possible and with as low a cost as possible from the viewpoint of quantity production. Since the time taken for a spectral analyzer to perform a testing on an LSI device is usually several tens of seconds, there exists a need to provide an LSI testing apparatus capable of operating at high speed.

SUMMARY OF THE INVENTION

It is therefore an object of the present invention to provide a high speed LSI spectral analysis testing apparatus and method.

Another object of the present invention is to provide a high precision LSI spectral analysis testing apparatus and method.

According to one aspect of the present invention, there is provided a testing apparatus comprising a test sequence generator for producing at least one sequence of test signals each having a different test pattern, and a source current sensor for detecting a source current flowing from a power voltage source to an integrated circuit device under test when the device is subjected to the sequence of test signals. Counter circuitry is provided for defining a window period equal to at least one sequence of the test signals. Analog-to-digital converter circuitry is arranged to sample the source current of the device during the window period and quantize sampled values of the source current to digital samples. A discrete Fourier transform (DFT) analyzer is provided for analyzing the digital samples to produce a plurality of spectral values at frequencies k/T, where T represents the period of said sequence and k is an integer equal to or greater than unity. Decision circuitry makes a decision on the analyzed spectral values using a plurality of reference spectral values.

According to another aspect, the present invention provides a testing method comprising the steps of generating at least one sequence of test signals each having a different test pattern, subjecting an integrated circuit device to the sequence of test signals so that the device consumes a source current supplied from a power voltage source, detecting the source current, defining a window period equal to at least one sequence of the test signals, sampling the source current of the device during the window period and quantizing sampled values of the source current to digital samples, analyzing the digital samples by using a discrete Fourier transform analyzer and producing a plurality of spectral values at frequencies k/T, where T represents the period of said sequence and k is an integer equal to or greater than unity, and making a decision on the analyzed spectral values using a plurality of reference spectral values.

Since the detected source current is sampled and quantized within a window period corresponding to at least one sequence of the test signals, the processing time necessary for the DFT analyzer to produce the spectral components is reduced significantly. Because of this high speed spectral analysis, the level of precision of the testing apparatus can be improved by setting the window size equal to an integral multiple of the sequence period to repeatedly apply the same test sequences to the device under test to produce a number of sequences of digital samples, and averaging the digital samples before or after the spectral analysis is performed by the DFT. A further improvement on the precision of the testing apparatus is achieved by subjecting the device under test to repeated sequences of the test signals before the detected source current is sampled. This stabilizes the device to a consistent active state.

BRIEF DESCRIPTION OF THE DRAWINGS

The present invention will be described in further detail with reference to the accompanying drawings, in which:

FIG. 4 shows a list of outputs of the power and phase comparators and the decision circuit of FIG. 3 regarding three LSI devices;

FIG. 5 is a block diagram of an LSI testing apparatus according to a third embodiment of the present invention; and FIG. 6 shows a list of outputs of the complex comparator and the decision circuit of FIG. 5 regarding three LSI devices.

DETAILED DESCRIPTION

Figure 1:
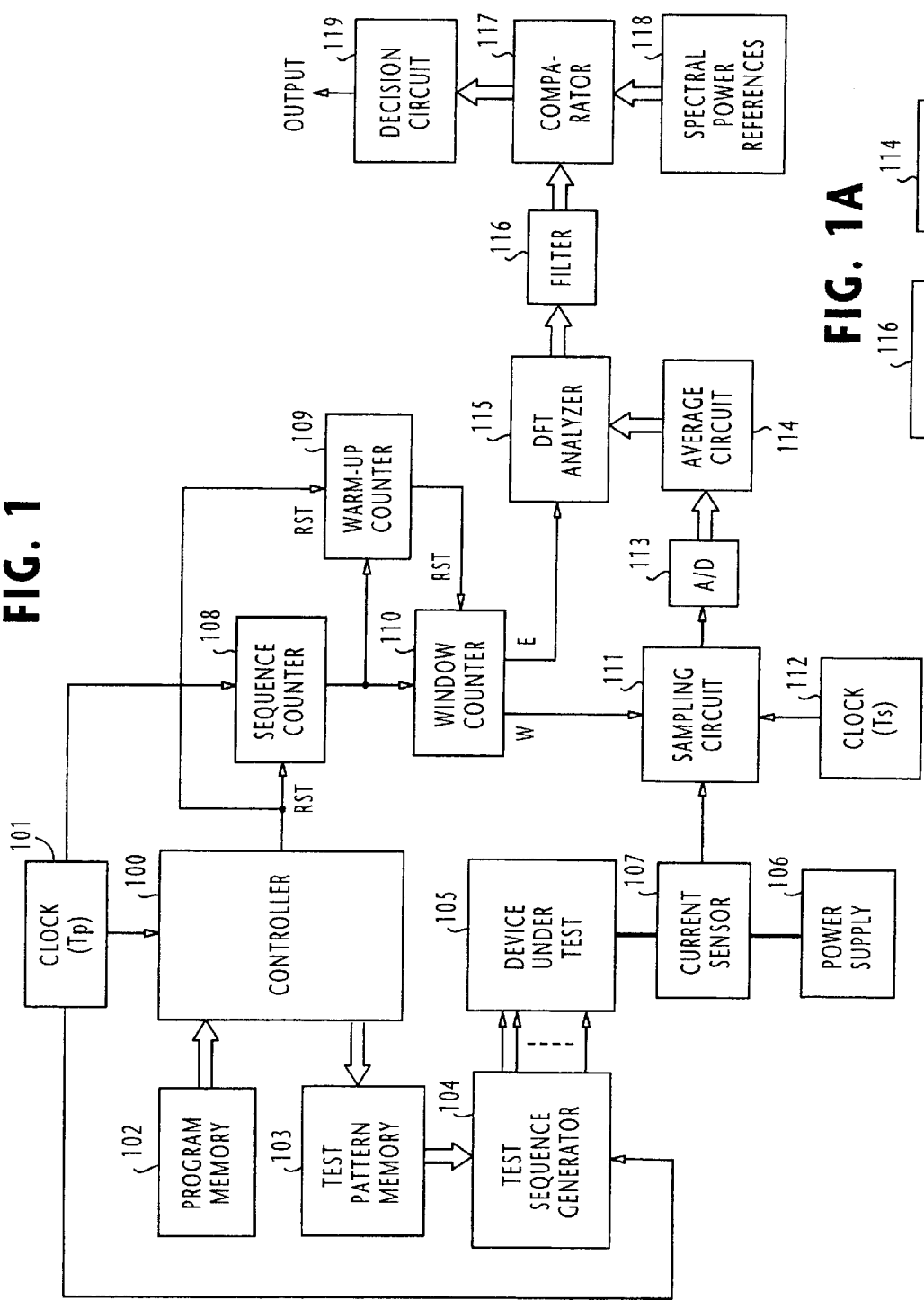
FIG. 1 is a block diagram of an LSI testing apparatus according to a first embodiment of the present invention.
Figure 2:
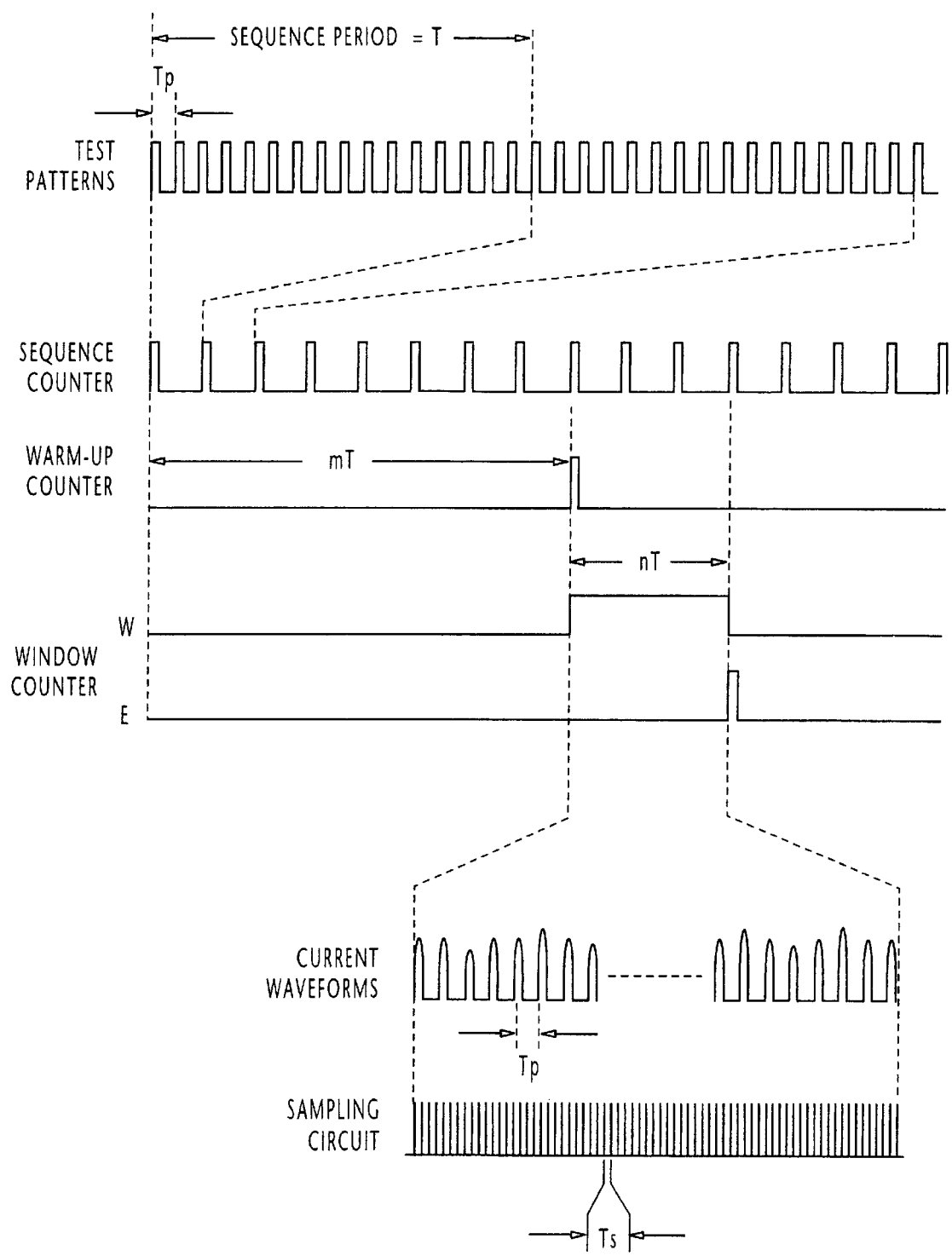
FIG. 2 is a timing diagram illustrating various waveforms produced in the block diagram of FIG. 1.

Referring now to FIG. 1, there is shown an LSI testing apparatus according to a first embodiment of the present invention. The testing apparatus includes a controller 100 that receives a clock pulse from a clock source 101 at intervals Tp. In response to this clock pulse, the controller reads an instruction from a program memory 102 and directs a test pattern memory 103 to supply a test pattern to a test sequence generator 104. In response, the test sequence generator 104 produces a plurality of test bits which are supplied to the input ports of an LSI device 105 under test. A DC voltage is supplied from a power supply unit 106 to the device under test via a current sensor 107. The source current consumed by the LSI device during the application of the test bits is detected by the current sensor and supplied to a sampling circuit 111. In this way, a sequence of test signals of different patterns is produced within a period T and the same sequence is repeatedly generated and applied to the LSI device as illustrated in FIG. 2.

A sequence counter 108 is reset by the controller at the beginning of each test sequence period T to start incrementing its count value in response to each clock pulse of the clock source 101 and produce an output pulse at the end of the period T. Sequence counter 108 thus produces output pulses at intervals T as illustrated in FIG. 2.

A warm-up counter 109 is provided to define a warm-up period. This counter is arranged to be reset by the controller to start counting the output of the sequence counter 108 and produces an output when the count equals a predetermined value (=m). During this warm-up period (i.e., mT), the device under test is repeatedly subjected to the same test sequences so that its internal elements are stabilized to an active state.

The output of the warm-up counter is used as a reset pulse of a window counter 110. In response to this reset pulse, the window counter begins a count operation on the output of sequence counter 108. Window counter 110 produces a window pulse W (i.e., nT) which lasts for a period starting at the time the reset pulse is supplied from the warm-up counter 109 and ending at the time the window counter attains a predetermined count value. The period of the window pulse thus equals an integral multiple (=n) of the sequence period T. As a typical example, the integer n is 10 and the integer m is 2 or 3. Window counter 110 further produces an enable pulse E at the trailing edge of the window pulse W as shown in FIG. 2.

Sampling circuit 111 is activated by the window pulse W. During the period of this window pulse, a sequence of similar analog current waveforms are produced by the LSI device and detected by the current sensor 106 and periodically sampled by the sampling circuit 111 in response to sampling pulses supplied at intervals Ts from a clock source 112.

The sampled analog values of the current waveforms are converted to digital samples by an analog-to-digital converter 113 and the digital values of these samples are averaged in an average circuit 114 by summing corresponding digital samples of the "n" test sequences and dividing the summed digital samples by the integer n.

Figure 1A:
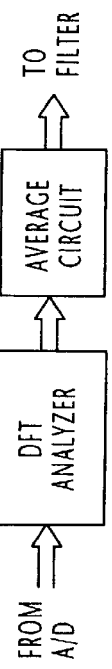
FIG. 1A is a block diagram of an alternative arrangement of a portion of FIG. 1.

Alternatively, the average circuit 114 may be connected between the DFT 115 and the spectral filter 116 as shown in FIG. 1A. In this case, the average circuit 114 provides a summing operation on corresponding spectral values of the "n" sequences and dividing the summed spectral values by the integer n.

A discrete Fourier transform (DFT) analyzer 115 is provided, which responds to the enable pulse E from the window counter 110 for performing a discrete Fourier transform analysis on the output of the average circuit 114 to produce signals indicating spectral complex values at fundamental frequency 1/T and harmonics 2/T, 3/T and 4/T, for example. Each of the analyzed spectral components is represented by a complex value a +jb, where a and b are integers and $j^2=-1$. In this embodiment, the complex value of each spectral component is then converted to $\sqrt{(a^2+b^2)}$ to represent the corresponding power level of the spectral component.

With the prior art spectral analyzer, the time taken to perform spectral analysis is several tens of seconds. Whereas, in the present invention the time taken by the DFT analyzer 115 is several milliseconds.

A spectral filter 116 is connected to the output of the DFT analyzer 115 to select spectral values necessary for comparison with reference spectral power levels.

A comparator 117 is connected to the output of the spectral filter 116 to determine whether each of the averaged spectral power levels falls within a corresponding one of a plurality of reference ranges stored in a register 118.

A decision circuit 119 determines a ratio of the number of power spectral values that are within the corresponding reference ranges to the number of those that are outside of the corresponding ranges and produces a decision signal depending on the determined ratio.

Since the amount of time taken by the DFT analyzer 115 is reduced in comparison with the prior art, the testing speed of LSI devices can be significantly improved, which is advantageous from the view point of quantity production. In addition, the averaging of the observed data by the average circuit 114 serves to improve the precision of LSI testing, solely or in combination with the warm-up operation which stablizes the LSI device.

Figure 3:
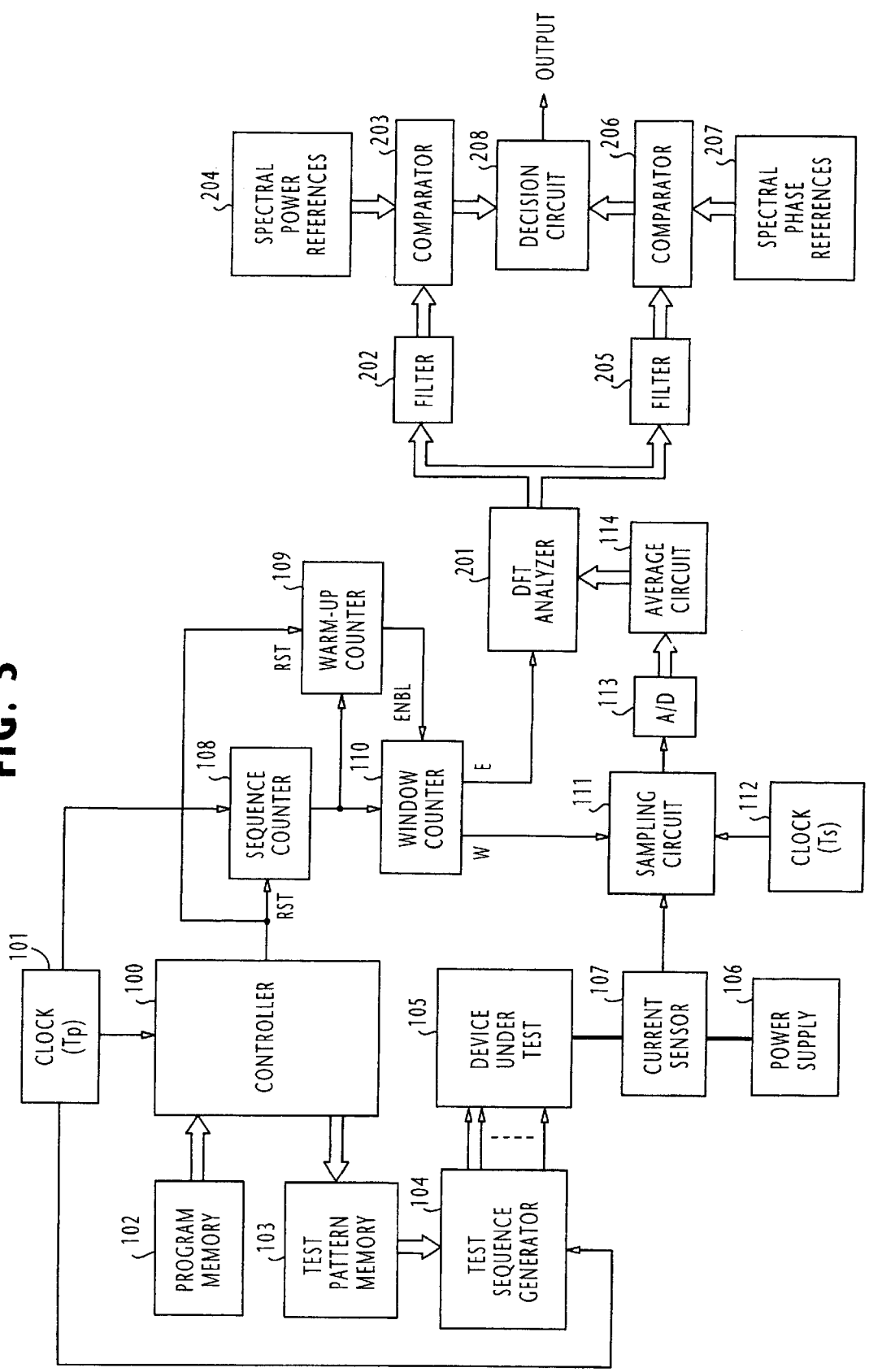
FIG. 3 is a block diagram of an LSI testing apparatus according to a second embodiment of the present invention.

The first embodiment of the present invention is modified as shown in FIG. 3. In this modification, DFT analyzer 201 produces signals indicating spectral complex values (a+jb) at fundamental frequency and harmonics and converts each of the complex values to $\sqrt{(a^2+b^2)}$ to represent the corresponding power level of the spectral component and $\tan^{-1}(b/a)$ to represent the corresponding phase value of the spectral component.

The analyzed power spectral components are supplied to a spectral filter 202 to pass only those spectral power components necessary for comparison with reference ranges and the analyzed phase spectral components are supplied to a spectral filter 205 to pass only those spectral phase components for comparison with reference ranges. The output of the filter 202 is supplied to a comparator 203, where each of power levels $\sqrt{(a^2+b^2)}$ at frequencies 1/T, 2/T, 3/T, 4/T and 5/T is compared with a corresponding range of reference spectral power values stored in a register 204. The output of filter 205 is applied to a comparator 206, where each of phase values $\tan^{-1}(b/a)$ at frequencies 1/T, 2/T, 3/T, 4/T and 5/T and a corresponding range of reference spectral phase values stored in a register 207. A decision circuit 208 receives the outputs of the comparators 203 and 206 for making a final decision on the results of the power and phase comparisons.

As shown in FIG. 4, five reference ranges of power levels and phase values may be stored in the registers 204 and 207, respectively and spectral measurement tests were performed on three devices A, B and C and the results of the tests are indicated. Regarding device A, both power and phase comparators 203 and 206 produce signals indicating that the observed values are all within corresponding reference ranges, while the results of the tests on device B indicate that three out of five observed power spectral points are within the reference ranges and all phase spectral values are within the reference ranges. On the other hand, device C indicates that only two of its spectral power values are within the reference range and only one of its spectral phase values is within the corresponding reference range. Depending on the ratio of good results to bad results, the decision circuit 208 makes a favorable decision on devices A and B and an unfavorable decision on device C. As a result, the level of precision attained by this embodiment is much higher than that attainable with the prior art.

FIG. 5 shows a further modification of the present invention in which spectral complex values are used for evaluation. In this modification, DFT analyzer 301 produces signals indicating spectral complex values (a+jb) at fundamental frequency and harmonics. The spectral complex values are filtered through a spectral filter 302 to pass those components necessary for comparison to a complex comparator 303, where each of complex values at frequencies 1/T, 2/T, 3/T, 4/T and 5/T is compared with a corresponding range of reference spectral complex values stored in a register 304. A decision circuit 305 receives the outputs of the comparator 303 for making a final decision on the results of the comparisons.

Spectral measurement tests were performed on three devices A, B and C and the results of the tests are indicated in FIG. 6. Regarding device A, the comparator 303 produces signals indicating that the observed complex values are all within corresponding reference ranges, while the results of the tests on device B indicate that three out of five observed complex values are within the reference ranges. On the other hand, device C indicates that only one of its spectral complex values is within the corresponding reference range. Depending on the ratio of good results to bad results, the decision circuit 305 makes a favorable decision on devices A and B and an unfavorable decision on device C.

Reference complex ranges may plotted in an X–Y coordinate plane to define the reference ranges as closed areas.

What is claimed is:

1. A testing apparatus comprising:
   a test sequence generator for producing at least one sequence of test signals each having a different test pattern;
   a source current sensor for detecting a source current flowing from a power voltage source to an integrated circuit device under test when the device is subjected to said sequence of test signals;
   counter circuitry for defining a window period equal to at least one sequence of said test signals;
   analog-to-digital converter circuitry for sampling the detected source current during said window period and quantizing sampled values of the source current to digital samples;
   a discrete Fourier transform analyzer for analyzing spectral components of the digital samples to produce a plurality of spectral values at frequencies k/T, where T represents the period of said sequence and k is an integer equal to or greater than unity; and
   decision circuitry for making a decision on said analyzed spectral values using a plurality of reference spectral values.

2. The testing apparatus of claim 1, wherein said window period corresponds to an integral multiple of said sequence, further comprising average circuitry for summing the digital samples of said analog-to-digital converter circuitry produced during one sequence of said integral multiple of said sequence with the digital samples produced during another sequence of said integral multiple of said sequence and dividing summed digital samples by said integral multiple to produce averaged digital samples, and wherein said discrete Fourier transform analyzer is arranged to analyze spectral components of the averaged digital samples.

3. The testing apparatus of claim 1, wherein said window period corresponds to an integral multiple of said sequence, further comprising average circuitry for summing the analyzed spectral values of said discrete Fourier transform analyzer produced during one sequence of said integral multiple of said sequence with the analyzed spectral values produced during another sequence of said integral multiple of said sequence and dividing summed spectral values by said integral multiple to produce averaged spectral values.

4. The testing apparatus of claim 1, wherein said counter circuitry is arranged to define a warm-up period corresponding to an integral multiple of said sequence prior to said window period, whereby said device under test is stabilized to an active state during the warm-up period and wherein said analog-to-digital converter circuitry is arranged to start sampling the source current of said device in response to the start of said window period.

5. The testing apparatus of claim 1, further comprising spectral filtering circuitry connected to said discrete Fourier transform analyzer for selecting and passing only spectral values necessary for making said decision by said decision circuit.

6. The testing apparatus of claim 1, wherein said analyzed spectral values are spectral power levels, and wherein said decision circuitry is arranged to make said decision on the spectral power levels using a plurality of reference spectral power levels.

7. The testing apparatus of claim 1, wherein said analyzed spectral values include spectral power levels and spectral phase values, and wherein said decision circuitry is arranged to make said decision on corresponding sets of the spectral power levels and the spectral phase values using a plurality of corresponding sets of reference spectral power levels and reference spectral phase values.

8. The testing apparatus of claim 1, wherein said analyzed spectral values are spectral complex values, and wherein said decision circuitry is arranged to make said decision on the spectral complex values using a plurality of reference spectral complex values.

9. A testing method comprising the steps of:
   a) generating at least one sequence of test signals each having a different test pattern;
   b) subjecting an integrated circuit device to said sequence of test signals so that the device consumes a source current supplied from a power voltage source;
   c) detecting said source current;
   d) defining a window period equal to at least one sequence of said test signals;
   e) sampling the detected source current during said window period and quantizing sampled values of the source current to digital samples;
   f) analyzing spectral components of the digital samples by using a discrete Fourier transform analyzer and producing a plurality of spectral values at frequencies k/T, where T represents the period of said sequence and k is an integer equal to or greater than unity; and
   g) making a decision on said analyzed spectral values using a plurality of reference values.

10. The testing method of claim 9, wherein said window period corresponds to an integral multiple of said sequence, further comprising the steps of summing the digital samples produced during one sequence of said integral multiple of said sequence with the digital samples produced during another sequence of said integral multiple of said sequence and dividing summed digital samples by said integral multiple to produce averaged digital samples, and wherein the step (f) analyzes spectral components of the averaged digital samples.

11. The testing method of claim 9, wherein said window period corresponds to an integral multiple of said sequence, further comprising the steps of summing the analyzed spectral values of the step (f) produced during one sequence of said integral multiple of said sequence with the analyzed spectral values produced during another sequence of said integral multiple of said sequence and dividing summed spectral values by said integral multiple to produce averaged spectral values.

12. The testing method of claim 9, wherein the step (d) defines a warm-up period corresponding to an integral multiple of said sequence prior to said window period, whereby said device under test is stabilized to an active state during the warm-up period and the step (e) starts sampling the source current of said device in response to the start of said window period.

13. The testing method of claim 9, further comprising the step of selecting spectral values of the step (f) necessary for performing the step (g).

14. The testing method of claim 9, wherein said analyzed spectral values are spectral power levels, and wherein the step (g) makes said decision on the spectral power levels using a plurality of reference spectral power levels.

15. The testing method of claim 9, wherein said analyzed spectral values include spectral power levels and spectral phase values, and wherein the step (f) makes said decision on corresponding sets of the spectral power levels and the spectral phase values using a plurality of corresponding sets of reference spectral power levels and reference spectral phase values.

16. The testing method of claim 9, wherein said analyzed spectral values are spectral complex values, and wherein the step (f) makes said decision on the spectral complex values using a plurality of reference spectral complex values.

\* \* \* \* \*